(12) United States Patent
Abeles

(10) Patent No.: US 6,192,058 B1
(45) Date of Patent: Feb. 20, 2001

(54) MULTIWAVELENGTH ACTIVELY MODE-LOCKED EXTERNAL CAVITY SEMICONDUCTOR LASER

(75) Inventor: Joseph Hy Abeles, Highland Park, NJ (US)

(73) Assignee: Sarnoff Corporation, Princeton, NJ (US)

( * ) Notice: Under 35 U.S.C. 154(b), the term of this patent shall be extended for 0 days.

(21) Appl. No.: 09/191,218

(22) Filed: Nov. 12, 1998

Related U.S. Application Data

(60) Provisional application No. 60/100,979, filed on Sep. 18, 1998.

(51) Int. Cl.[7] ..................................................... H01S 3/30
(52) U.S. Cl. ........................ 372/6; 376/6; 376/5; 376/108; 376/20; 376/21; 376/23; 376/18; 376/92; 376/82; 376/25; 376/29; 376/102; 359/341; 359/124; 359/127; 359/130; 385/37; 385/32
(58) Field of Search ................................. 372/6, 50, 108, 372/20, 21, 23, 18, 92, 82, 25, 29, 102; 359/341, 124, 127, 130; 385/37, 32

(56) References Cited

U.S. PATENT DOCUMENTS

| | | | |
|---|---|---|---|
| 3,849,604 | 11/1974 | Benes et al. | 179/15 |
| 4,807,227 | 2/1989 | Fujiwara | 370/3 |
| 4,873,681 | 10/1989 | Arthurs et al. | 370/3 |
| 4,945,531 | 7/1990 | Suzuki | 370/3 |
| 5,005,167 | 4/1991 | Arthurs et al. | 370/4 |
| 5,113,459 | 5/1992 | Grasso et al. | 385/24 |
| 5,121,381 | 6/1992 | Takahashi et al. | 359/117 |
| 5,128,956 | 7/1992 | Aoki et al. | |
| 5,140,456 | 8/1992 | Huber | 359/341 |
| 5,166,821 | 11/1992 | Huber | 359/238 |
| 5,194,977 | 3/1993 | Nishio | 359/128 |
| 5,208,691 | 5/1993 | Nishio | 359/123 |
| 5,222,089 | 6/1993 | Huber | 372/26 |
| 5,265,107 | 11/1993 | Delfyett, Jr. | |
| 5,278,686 | 1/1994 | Grasso et al. | 359/110 |
| 5,282,079 | 1/1994 | Laming et al. | 359/341 |
| 5,283,686 | 2/1994 | Huber | 359/337 |
| 5,295,209 | 3/1994 | Huber | |
| 5,321,540 | 6/1994 | Takai et al. | 359/124 |
| 5,347,525 | 9/1994 | Faris | 372/19 |
| 5,347,527 | 9/1994 | Favre et al. | 372/20 |
| 5,469,454 * | 11/1995 | Delfyett, Jr. | 372/18 |
| 5,488,500 | 1/1996 | Glance | 359/127 |
| 5,493,433 | 2/1996 | Prucnal et al. | 359/123 |
| 5,495,356 | 2/1996 | Sharony et al. | 359/128 |
| 5,504,609 | 4/1996 | Alexander et al. | 359/125 |
| 5,506,710 | 4/1996 | Hamel | 359/115 |
| 5,532,864 | 7/1996 | Alexander et al. | 359/177 |
| 5,550,666 | 8/1996 | Zirngibl | 359/125 |
| 5,557,439 | 9/1996 | Alexander et al. | 359/130 |
| 5,559,624 | 9/1996 | Darcie et al. | 359/125 |
| 5,574,584 | 11/1996 | Darcie et al. | 359/125 |
| 5,587,830 | 12/1996 | Chraplyvy et al. | 359/341 |
| 5,590,142 | 12/1996 | Shan | |
| 5,600,742 | 2/1997 | Zirngibl | 385/37 |
| 5,623,356 | 4/1997 | Kaminow et al. | 359/123 |
| 5,627,925 | 5/1997 | Alferness et al. | 385/17 |
| 5,631,758 | 5/1997 | Knox et al. | 359/127 |
| 5,633,741 | 5/1997 | Giles | 359/124 |
| 5,654,816 | 8/1997 | Fishman | 359/177 |
| 5,673,129 | 9/1997 | Mizrahi | 359/124 |
| 5,673,342 | 9/1997 | Nelson et al. | 385/24 |
| 5,680,490 | 10/1997 | Cohen et al. | 385/24 |
| 5,694,234 | 12/1997 | Darcie et al. | 359/125 |
| 5,696,615 | 12/1997 | Alexander | 359/134 |
| 5,710,649 | 1/1998 | Mollenauer | 359/123 |
| 5,712,716 | 1/1998 | Vanoli et al. | 359/125 |
| 5,712,932 | 1/1998 | Alexander et al. | 385/24 |
| 5,712,936 | 1/1998 | Hoag et al. | 385/24 |
| 5,715,076 | 2/1998 | Alexander et al. | 359/130 |
| 5,719,696 | 2/1998 | Chraplyvy et al. | 359/341 |
| 5,726,784 | 3/1998 | Alexander et al. | 359/125 |
| 5,734,486 | 3/1998 | Guillemot et al. | 359/139 |
| 5,742,416 | 4/1998 | Mizrahi | 359/134 |
| 5,748,349 | 5/1998 | Mizrahi | 359/130 |
| 5,748,350 | 5/1998 | Pan et al. | 359/130 |
| 5,754,320 | 5/1998 | Watanabe et al. | 359/117 |
| 5,761,351 | 6/1998 | Johnson | 385/15 |
| 5,778,118 | 7/1998 | Sridhar | 385/24 |
| 5,784,184 | 7/1998 | Alexander et al. | 359/125 |
| 5,786,916 | 7/1998 | Okayama et al. | 359/128 |
| 6,014,237 * | 1/2000 | Abeles et al. | 359/124 |

OTHER PUBLICATIONS

H. Shi, "Broadband spectral coupling in multiwavelength mode–locked semiconductor laser" Laser and Electro–Optic, 1998. pp. 441–442.*
H. Shi, "Timing jitter performance of multiwavelngth modelocked semiconductor laser", Elesctronic Latters, Nov. 12, 1998. vol. 34, No. 23, pp. 2250–2252.*
H. Shi, 20*5 Gbits/s optical WDM–TDM transmitter using a single–stripe multiwavelength mode–locked semiconductor laser, Laser and Electro–Optics, pp. 311–312.*
Bellcore Technical Reference TR–NWT–000468, Reliability Assurance Practices for Optoelectronic Devices in Interoffice Applications (Bellcore, Livingston, NJ) Dec, 1991.
Cundiff, et al., "Effect of fiber nonlinearity on the propagation of highly chirped pulses in a WDM system," *OFC '98 Technical Digest*, Friday Morning, pp. 397–398.
K. Hall, et al., "CMA2, Interferometric All–Optical Switching Using Nonlinearities in Semiconductor Optical Amplifiers Biased at Transparency," 1998 Conference on Lasers and Electro–Optics and published in the Optical Society of America.
Shi, et al., presentation entitled "Four–Wavelength, 10–Ghz Picosecond Pulse Generation From an Active Mode–Locked Single–Stripe Diode Laser," given May 20, 1997 at the 1997 Conference on Lasers and Electro–Optics.
M.R. Amersfoort et al., "Monolithic Multiwavelength Lasers for WDM Systems" SPIE vol. 3006, pp. 134–144 1997.

* cited by examiner

*Primary Examiner*—Frank G. Font
*Assistant Examiner*—Delma R. Flores Ruiz
(74) *Attorney, Agent, or Firm*—William J. Burke

(57) ABSTRACT

A multiwavelength mode-locked (MWML) angled-stripe SOA laser that emits multiple discrete groups of wavelengths simultaneously in a short time interval, where each group is located at a wavelength suitable to wavelength division multiplexed optical transmission. Feedback and/or feedthrough optics are combined with a angled-stripe SOA to provide different laser embodiments. The actively mode locked MWML laser emits individual spectral components at a plurality of wavelengths simultaneously. The optics are coupled to one or more angled-stripe SOA ports in reflective or optical ring resonator configurations to provide simultaneous feedback at the plurality of wavelengths and to provide substantially identical round-trip travel times and net gains within the lasing cavity for pulses at each of the plurality of wavelengths. A MWML laser so formed is particularly useful as a multiwavelength source for optical signal processing and transmission systems and can be placed in a hermetically sealed package.

26 Claims, 8 Drawing Sheets

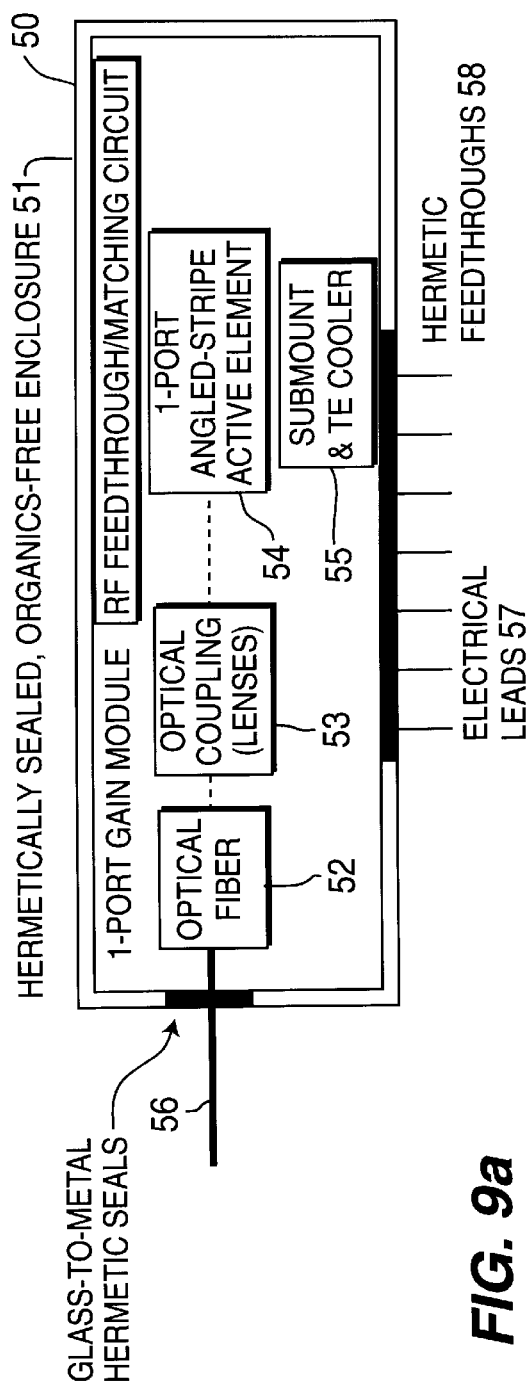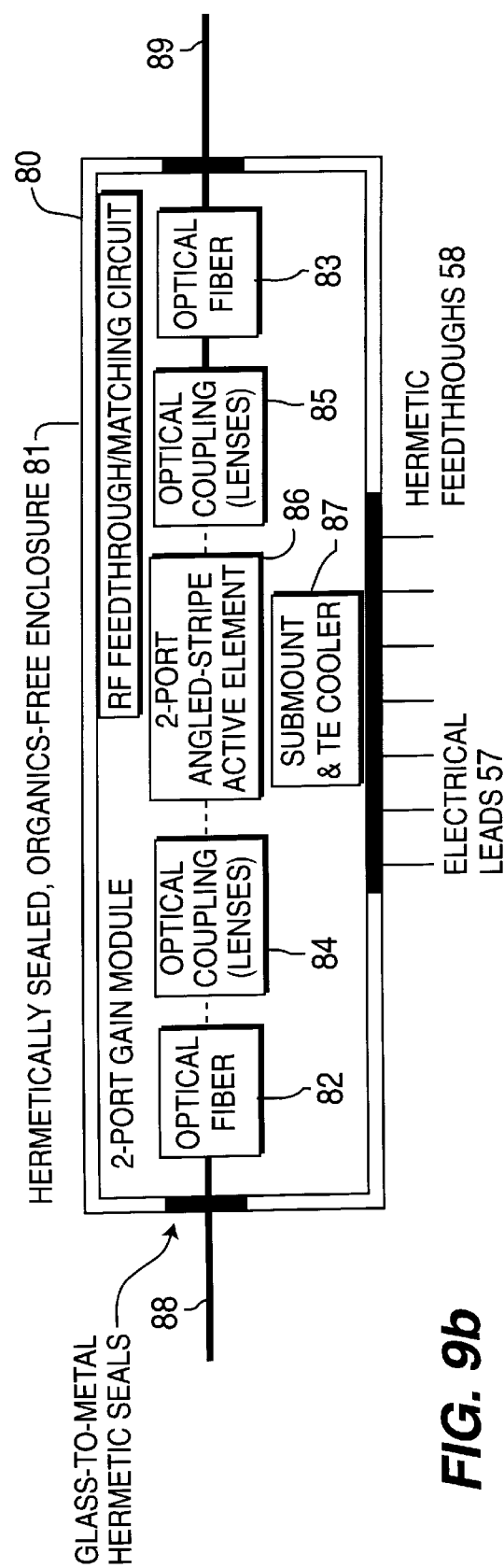
FIG. 9a
FIG. 9b

MULTIWAVELENGTH ACTIVELY MODE-LOCKED EXTERNAL CAVITY SEMICONDUCTOR LASER

CROSS-REFERENCE TO RELATED APPLICATIONS

This application claims the benefit of the filing date of U.S. Provisional Patent Application No. 60/100,979, filed Sep. 18, 1998.

BACKGROUND OF THE INVENTION

1. Field of the Invention

The present invention relates to a multiwavelength actively mode locked external cavity semiconductor laser useful in fiber optic telecommunications systems and in other applications employing wavelength division multiplexing of high speed digital or analog optical signals and, more particularly, to a multiwavelength actively mode-locked external cavity semiconductor laser for the simultaneous reliable generation of multiple optical carrier signals for use in such systems.

2. Description of the Prior Art

Prior art multiwavelength optical signal processing and transmission systems rely upon optical sources to generate optical carriers for modulation of digital, or analog, data by a multiplicity of modulators. The modulated optical carriers propagate within substantially identical single transverse spatial modes occupying substantially the same position in a transmission medium as may be provided by single-mode waveguides, such as optical fibers or planar optical waveguides, or by free-space optics. Each modulated optical carrier can be separately distinguished from all others by means of an optical filter designed to pass, to one or more output ports, a given optical carrier wavelength while rejecting all others presented at its input port. Such a modulated optical carrier can be demodulated to convert information carried thereupon to electronic form. Systems employing multiple optical carriers distinguished by wavelength are designated as dense wavelength division multiplexing (DWDM) systems.

The optical sources employed in prior art DWDM systems are discrete laser source components, one for each wavelength. Reliability of these sources is assured by practices such as extended life-testing and thermal, electrical, and mechanical tests known to those skilled in the art, as exemplified by Bellcore TR-NWT-000468. Such laser sources are typically continuous wave, single frequency, single spatial mode diode lasers, conventionally of the distributed feedback (DFB) design, such that, e.g., a 40-wavelength system employs 40 separate DFB laser sources and 40 separate manufactured subsystems containing additional fiber optic, electronic, and electromechanical components and their interconnections including a single fiber optic output port to carry each modulated optical carrier for further combination with all others. Therefore, each such subsystem includes overhead in the form of additional components that are duplicated for each separate optical carrier wavelength.

It is the reliance upon single wavelength optical sources which requires prior art multiwavelength system architects to design an entire subsystem, not merely one source, for each optical carrier wavelength in prior art systems. The major sources of complexity and cost of a multiwavelength transmissions systems product are electronic, optical, and electromechanical components, their assembly, and related costs for assembly and manufacturing processes. These costs all accrue separately for each optical source. Therefore, single wavelength optical sources represent a serious disadvantage for the manufactured system because their use requires that the latter costs must be aggregated to the extent of the number of optical carrier wavelengths employed. Systems relying upon such aggregation are large in size, consume excessive power, and suffer from reliability concerns or require undesirably frequent maintenance associated with the use of a large number of optical source components.

The prior art contains examples of continuous wave (cw) optical source components capable of emitting multiple optical carriers simultaneously. In general, cw sources exhibit inherent shortcomings as compared to pulsed sources. A technique capable of generating multiple cw optical carriers simultaneously, put forth by Zah et al., requires a monolithic chip containing multiple DFB lasers. For practical purposes, the complexity of such optoelectronic integrated circuits results in low yield and high cost. In addition, the difficulty of packaging and qualifying for reliability assurance, as required for telecommunication applications, a source module including 20 or more separate lasers, as these devices must, involves significant challenges over and above those of demonstrating the devices' functionality.

Unlike pulsed lasers, individual cw lasers, whether tunable or single-wavelength, are unable to emit multiple optical carriers simultaneously. In contrast to cw schemes, pulsed operation bestows a particular advantage with respect to the dynamics of net gain, defined as the difference between the roundtrip gain provided by an amplifying medium and round-trip propagation loss within the laser resonator expressed in dB. The net gain transiently exceeds threshold for the highest net gain mode by a margin sufficient to permit the net gain for a multiplicity of additional modes to exceed threshold and thus for them, too, to lase. Such a margin cannot be maintained in steady state cw operation within a single gain medium because there the steady-state phenomenon of net gain clamping ensures that only a single mode is able to reach threshold.

Mode-locked pulsed laser operation, by contrast, offers significant advantage over cw operation for multiwavelength operation, as shown by Delfyett et al. A conventional mode-locked pulsed laser operates with substantial equality between round-trip travel time of an optical signal within the laser resonator and the pulse period divided by an integer factor greater than or equal to unity. When substantially transform-limited, a mode-locked pulsed laser emits Gaussian pulses occupying a full-width half maximum frequency spectrum $\Delta v$ determined by $\Delta t \Delta v=0.4413$, where $\Delta t$ is the full-width half maximum pulse duration.

An actively mode-locked laser is one in which a periodic variation is impressed upon net gain. In an actively mode-locked semiconductor external cavity laser (AMSECL) of the type described by Delfyett et al., optical gain is provided by an angled-stripe semiconductor optical amplifier (SOA). The minimum fundamental period of pulses emitted by an AMSECL, i.e., for which the aforementioned integer factor is unity, is limited by the practical cavity size. For free-space optical components, an approximate practical lower bound would be 167 psec for fundamental mode-locked pulses, corresponding to approximately a 2.5 cm cavity. In general, other considerations may indicate a design of substantially larger cavity AMSECLs. Either harmonic mode-locking in which the integer factor exceeds unity or pulse interleaving subsequent to the AMSECL can be employed to attain shorter periods than generated by the AMSECL, as taught in the prior art.

The AMSECL has a number of advantages over other mode-locked lasers. Because it is based on the angled-stripe SOA, it can be made small and relatively inexpensive. Only a single angled-stripe SOA is required as the optical gain element of the AMSECL. As a two-terminal device, the angled-stripe SOA is simple to design. It is similar to, but simpler in design than, a DFB laser. Additionally, there is no need to invoke the complexity involved in separate pumping and amplifying components as required for active fiber amplifiers. Beyond feedback and collimation optics, no additional components are required.

In a conventional AMSECL net optical gain in the angled-stripe SOA is varied by direct application of periodic electrical bias to the angled-stripe SOA at an RF frequency substantially equal to the laser pulsation rate. The frequency spectrum of pulses emitted by a conventional AMSECL is accordingly modified from that of a cw laser. Additional frequency components are emitted at discrete frequency intervals from the fundamental component, corresponding to the pulsation rate in the case of fundamental mode-locking. The number of substantial wavelength components associated with a given fundamental component is such that the total frequency spectrum occupied by a fundamental and associated additional wavelength components is substantially equal to the inverse of pulse duration. While mode-locked, the fundamental wavelength emitted by a laser is not uniquely distinguishable such that a uniform comb of frequencies is emitted as illustrated in FIG. 1, showing the case of a conventional mode-locked laser having a fundamental pulse repetition period of 2.5 GHz.

A prior art method seeks to exploit individual wavelength components within a mode-locked frequency comb as optical carriers, requiring pulse duration below 100 fsec to cover the 40 nm band required for multiwavelength systems. Typical prior art methods for generation of 100 fsec pulses require the use of active fiber amplifiers which are more expensive and complex than angled-stripe SOAs. Generation of 100 fsec pulses further requires more complex and expensive optical systems beyond those required by an AMSECL. Another disadvantage is the fundamental repetition rate of 100 GHz, as required to achieve 100 GHz channel spacing. For these reasons, the use of ultrashort pulses (below 1 psec) or individual mode-locked frequency components as optical carriers is not a preferred method for use in multiwavelength optical signal processing and transmission systems.

As illustrated in FIG. 1, conventional mode-locked lasers are characterized by one fundamental component and thus one single comb of frequency components. The comb is relatively narrow in frequency spectrum compared to channel spacings. Therefore, for the purposes of multiwavelength optical signal processing and transmission systems, it is preferred to employ the entire comb as a single optical carrier. Accordingly, such mode-locked lasers are considered as single wavelength mode-locked lasers from the standpoint of DWDM systems.

A multiple optical carrier source is desired which takes of advantage of the feature of pulsed lasers to reliably emit many wavelengths simultaneously.

A multiwavelength mode-locked (MWML) laser which addresses these problems has been proposed by Delfyett et al. In the proposed system, a MWML single stripe angled-stripe SOA laser is an AMSECL in which a multiplicity of fundamental frequency components is emitted, where each fundamental frequency component is associated with its own unique set of additional frequency components such that each fundamental frequency and additional frequency components make up a unique comb of frequency components such that, as illustrated in FIG. 2, a multiplicity of combs of frequency components is emitted by the MWML laser. In the time domain, the MWML laser emits pulses of overall duration approximately equal to the inverse of the spectral width of each comb in the frequency domain. Unlike other mode-locked lasers, the MWML laser simultaneously emits a multiplicity of pulses of differing wavelengths corresponding to the position of the combs in the frequency domain. An embodiment of this MWML laser is illustrated in FIG. 3.

FIG. 3 illustrates the Delfyett et al. MWML laser light source 10 comprising an angled-stripe SOA 12 which is biased with a periodic signal at a radio frequency from an RF source 14, and an intracavity spatial filter 16 which filters an output of the angled-stripe SOA 12 to define individual spectral components at a plurality of wavelengths. Circulating within the MWML cavity are pulses generated at the plurality of wavelengths simultaneously which have round trip optical cavity travel times and net gains which are substantially equal at each generated wavelength. The spatial filter 16 in conjunction with the grating 18 may be selectively tuned to predetermined wavelengths by translating the spatial filter 16 in a plane normal to the output of the spatial filter 16. The radio frequency signal is provided to the angled-stripe SOA 12 by clock source 14 in conjunction with a direct current bias so that the angled-stripe SOA 12 couples the cavity modes together to generate periodic mode-locked pulses. The angled-stripe SOA 12 preferably comprises an angled-stripe InGaAsP, an angled-stripe GaAs/AlGaAs or an angled-stripe SOA of another material composition with facet reflectivities of $10^{-6}$ or less. Such low reflectivity is necessary to keep the gain spectrum of the angled-stripe SOA 12 free of undulations due to Fabry-Perot modes which otherwise would interfere with the generation of multiple wavelengths, since some wavelengths would be emphasized while others would be muted by such undulations. Other bulk optics devices are also used in the design of FIG. 3, including lenses 20, 22, 24, and 26 and mirrors 28, 30, and 32.

The ability of the MWML laser light source 10 illustrated in FIG. 3 to simultaneously emit multiple frequency combs as illustrated in FIG. 2 is a unique characteristic which enables it to be used as a optical carrier source for multi-wavelength optical signal processing and transmission systems. In such applications, each frequency comb is a discrete wavelength source which can independently serve as a carrier for optical signaling purposes. MWML laser light source 10 can thereby eliminate the need for a multiplicity of cw light sources to serve as carriers for a WDM transmission system, for each comb may be considered to represent a single wavelength source for WDM applications.

In practice, under modulation the linewidth of each of the frequencies within a comb may become broadened so as to merge each comb into a single spectral peak of width equivalent to the comb envelope, with each comb serving as a carrier wavelength for signaling purposes in WDM communications systems.

A MWML laser light source 10 of the type shown in FIG. 3 comprises a broad-spectrum gain medium such as angled-stripe SOA 12 and a cavity designed to provide simultaneous feedback at a multiplicity of wavelengths and to provide substantially identical round-trip travel time and net gain for pulses at each of the various wavelengths within the cavity. While the MWML laser source of FIG. 3 demonstrates the basic principle of multiwavelength AMSECLs (MW- AMSECLs), the design of FIG. 3 has limited potential for commercial application in that it cannot be readily placed in a hermetically sealed package containing no substantial organic materials such as is required for use in commercial telecommunications applications.

The present invention relates to alternative implementations of the MW-AMSECL of FIG. 3 which are better suited to broad commercial application in multiwavelength optical signal processing and transmission systems and which overcome the aforementioned limitations of the prior art.

SUMMARY OF THE INVENTION

A MW-AMSECL source of the invention emits multiple discrete optical pulses simultaneously and periodically during short time intervals, where each discrete pulse is characterized by a frequency spectrum suitable to one among a plurality of wavelengths required by a multiwavelength optical signal processing or transmission system. One-port feedback and/or two-port feedthrough modules are combined with one or more one- or two-port gain modules to provide a Fabry-Perot cavity or ring resonator to provide simultaneous feedback at a plurality of wavelengths. In particular, the modules are arranged to provide substantially identical round-trip travel times within the lasing cavity for pulses at all wavelengths emitted by the MWML laser, and to provide substantially identical net optical gain for signals of all wavelengths emitted by the MWML laser.

The MWML laser comprising these components is packaged such that key active components, such as SOAs, saturable absorbers, and modulators, are contained in one or more hermetically sealed single-mode-fiber pigtailed enclosures which are internally free of organic materials such as epoxy, key passive components are contained in one or more temperature-controlled enclosures, and all components are interconnected using single-mode fiber ports. Accordingly, reliability assurance and qualification of the angled-stripe SOA can be accomplished with methods no more complex than those employed with DFB lasers. The SOA is contained in such a package interconnected by one or two single-mode fiber ports and withstands thermal, mechanical, and electrical stress cycling as well as extended life-testing. The MWML laser and all its components are thus packaged in a manner suited for reliability assurance and reliability qualification according to standards such as those described within Bellcore TR-NWT-000468.

In certain embodiments of the invention, a one-port SOA is employed which provides a substantial reflectivity gain, such that the SOA provides gain for reflected signals incident on its single port. A portion of the optical signal being amplified within such a one-port SOA may or may not emerge through a second port for further use external to the MWML system, such as for output coupling.

In other embodiments of the invention, a two-port SOA is employed which provides substantially no reflection within, such that the SOA provides gain for transmitted signals incident at either of its two ports.

Preferably, the SOA employs an angled-stripe active region composed of InGaAs, InGaAsP, or alternative III–V semiconductor optoelectronic amplifying material compositions.

Preferably, feedback optics having either one port or two ports employ one or more wavelength-selective elements such as fiber gratings that preferentially reflect and/or transmit discrete wavelengths of light received from the angled-stripe SOA port.

In a first embodiment, a one-port angled-stripe SOA is employed in conjunction with feedback optics in a Fabry-Perot cavity configuration such that the round trip travel time and net gain are equal for each of multiple wavelengths reflected. The feedback optics preferably consist of a single-mode fiber containing multiple gratings, each of periodicity corresponding to one of the plurality of MWML laser wavelengths, all situated at substantially the same position along the length of the fiber, thereby substantially satisfying the aforementioned round-trip-time criterion.

In a second embodiment, two substantially identical, but dispersion-reversed, feedback optics are employed which provide differing round-trip times for different wavelengths in conjunction with a dual-port SOA arranged in a Fabry-Perot cavity configuration. Preferably, these feedback optics are arranged such that the differing round-trip times of the two compensate each other whereby the round-trip travel times for all wavelengths are equal, by connecting one to one port of the dual-port SOA and the other to another port of the dual-port SOA. Preferably, the feedback optics comprise grating structures each having a plurality of grating structures situated in separate non-overlapping positions along the length of the fiber with distinct periodicities each reflecting one of the plurality of MWML laser wavelengths, where respective grating structures in the first fiber grating reflect respectively shorter, or longer in the case of the second fiber grating, discrete wavelengths from its port.

In another embodiment, feedthrough optics are employed which preferably comprise a grating filter interfaced to the first and second ports of the angled-stripe SOA in an optical ring resonator configuration. The feedthrough optics may include a plurality of cascaded transmission filters which pass light in respective narrower optical frequency bands and block the light in a wider optical frequency bands. The plurality of transmission filters may include, in one embodiment, grating filters situated in single-mode fiber or, in another embodiment, may include grating filters situated within a planar waveguide. In either case, the function of the filters is to permit a plurality of discrete wavelengths to be passed from an input thereof to an output thereof while not transmitting light outside of the narrower bands of the plurality of cascaded transmission filters. Optical isolators are employed within the feedthrough optics to suppress unwanted lasing modes.

In a further embodiment, two feedback optics are employed which provide differing round-trip travel times for different wavelengths in conjunction with a single-port SOA. Preferably, these feedback optics comprise two fiber grating structures and an optical circulator having a first port interfaced to the port of a single-port SOA and second and third ports connected to respective ends of the fiber grating structures in an optical ring resonator configuration. The first and second fiber grating structures each have a plurality of grating structures situated in separate non-overlapping positions along the length of the fiber with distinct periodicities each reflecting one MWML laser wavelength, where respective grating structures in each of the first and second fiber gratings reflect respectively shorter wavelengths from a first end to a second end of each grating. The first and second fiber gratings are then arranged such that the first fiber grating has its first end interfaced with the second optical circulator port and the second fiber grating has its second end interfaced with the third optical circulator port so as to provide substantially identical round-trip travel times within the lasing cavity for pulses of each MWML wavelength. In a modified embodiment, the optical circulator is replaced by a modulator which selectively directs pulses at the plurality of wavelengths from the output port of the angled-stripe SOA to the first and second gratings so as to provide alternating feedback paths to the angled-stripe SOA such that the roundtrip travel time for each wavelength is substantially identical.

In additional embodiments, the feedback optics includes a fiber grating structure, a cavity length adjusting arm, and an optical circulator having a first port interfaced to the output port of the angled-stripe SOA, a second port connected to the fiber grating, and a third port connected to a cavity length adjusting arm.

In still other embodiments, a second angled-stripe SOA may also be provided and be connected using a single mode fiber splitter such that each angled-stripe SOA is connected via a port to one arm of the splitter.

BRIEF DESCRIPTION OF THE DRAWINGS

The present invention will be better understood after reading the following detailed description of the presently preferred embodiments thereof with reference to the appended drawings, in which:

FIG. 4(a) illustrates a 1-port gain medium with feedback optics coupled to its single port to provide a laser resonator.

FIG. 4(b) illustrates a 2-port gain medium with feedback optics coupled to each port to provide a laser resonator.

FIG. 4(c) illustrates a 2-port gain medium combined with feedthrough optics to provide an optical ring resonator.

FIG. 4(d) illustrates a 1-port gain medium combined with feedthrough optics and an optical circulator to provide a laser resonator, also of the ring type.

FIG. 4(e) illustrates the use of a circulator to provide multiple feedback optics to a single 1-port gain element to ensure substantially equal round trip travel times for all wavelengths.

FIG. 4(f) illustrates an alternative arrangement to FIG. 4(e) in which a modulator is employed to alternately direct the pulses from one set of feedback optics to the other, also allowing dual reflective feedback elements to be used.

FIG. 4(g) illustrates the use of a length adjusting arm with a circulator of a similar configuration to that used in FIG. 4(e).

FIG. 4(h) illustrates the use of two gain media with a splitter to provide redundancy against failure of the gain medium.

FIGS. 9(a)–9(b) respectively illustrate 1-port and 2-port hermetically sealed gain modules in accordance with the invention.

DETAILED DESCRIPTION OF THE PREFERRED EMBODIMENTS

A system and method which meets the above-mentioned objects and provides other beneficial features in accordance with the presently preferred exemplary embodiments of the invention will be described below with reference to FIGS. 4–11. Those skilled in the art will readily appreciate that the description given herein with respect to those figures is for explanatory purposes only and is not intended in any way to limit the scope of the invention.

FIGS. 4(a)–4(h) illustrate several embodiments of the construction of a MWML laser resonator (cavity) designed to provide simultaneous feedback at a multiplicity of wavelengths and to provide nearly identical round-trip travel times for pulses at each of the various wavelengths within the cavity. The examples shown in FIGS. 4(a)–4(h) are illustrative of a MWML laser of the type described above with respect to FIG. 3 with densely spaced cavity modes such that many cavity modes are included in each frequency comb. However, the embodiments of FIG. 4 all utilize components which may be readily included in suitably small hermetically sealed packages of the type used in conventional commercial optics applications.

Figure 1:
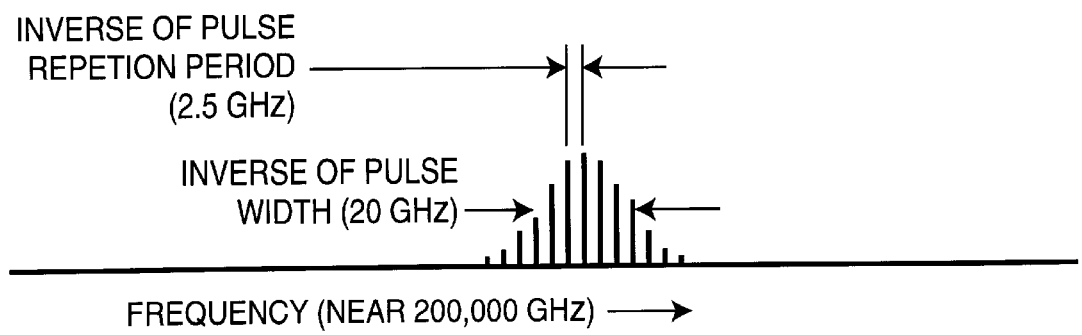
FIG. 1 illustrates the single frequency comb of a conventional mode-locked laser having a fundamental pulse repetition period of 2.5 GHz.
Figure 2:
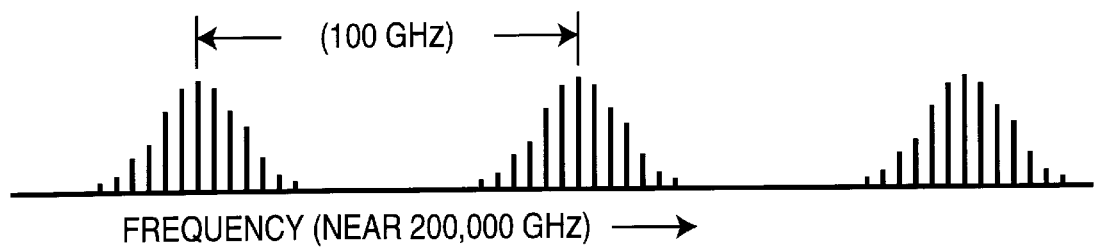
FIG. 2 illustrates the multiplicity of combs of frequency components of a multiwavelength mode-locked (MWML) angled-stripe SOA laser.
Figure 3:
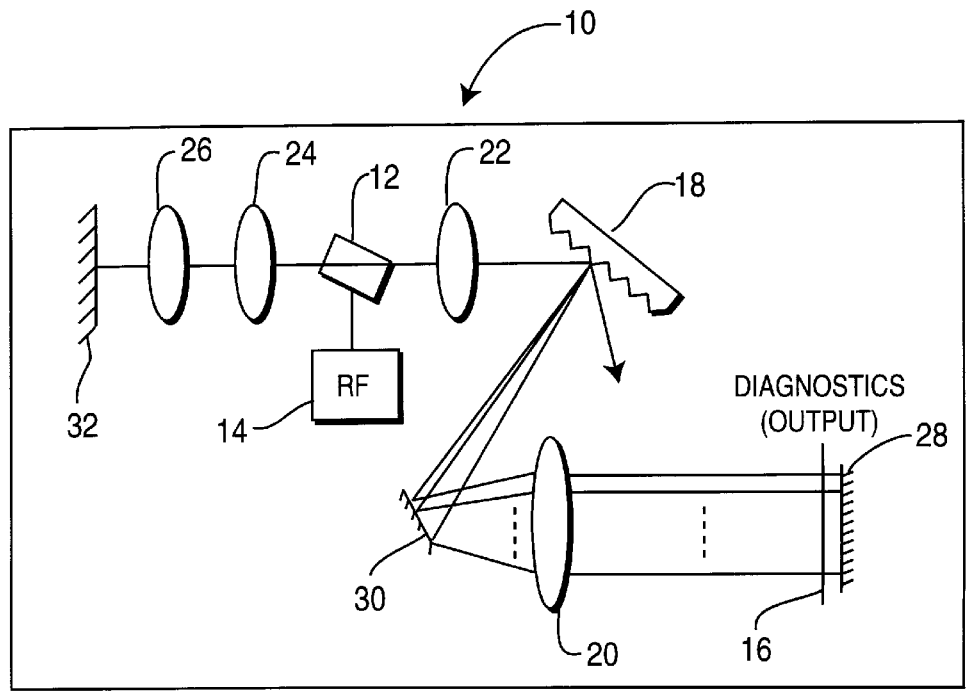
FIG. 3 is a schematic diagram of a prior art single-stripe MWML semiconductor laser using bulk optics in the laser resonator.

The MWML laser of FIG. 3 employs free-space optics to interconnect key components such as the SOA and feedback optics. As such, the MWML laser of FIG. 3 does not support the basic requirements for reliability assurance and reliability qualification which demand that key components such as the SOA be packaged with single-mode fiber optical port interfaces. Accordingly, the MWML laser of FIG. 3 is not suitable for most commercial uses. A primary purpose of the invention is to provide a MWML laser design in which the critical and active components may be contained within hermetically sealed single-mode fiber pigtailed packages such that no organic materials such as epoxy are contained within the packages. In each embodiment of FIG. 4, the only connection from the gain media in the hermetically sealed package to the outside world is through an optical fiber, where the sealed package has no organic substances, such as epoxy, therein which may affect the laser's operation The term "feedback module" as it is used with reference to FIG. 4 denotes an arrangement of optical components whose function is to return light incident upon its single port for emission from its single port such that the proportion of light energy returning from the port as compared to that incident upon the port is dependent upon the wavelength of the light. The dependence upon the wavelength of the light provides a filtering effect intended to define the wavelengths of lasing of the MWML laser such that wavelengths experiencing a greater proportion of returned light energy are, in general, chosen as lasing wavelengths over those wavelengths experiencing a lesser proportion of returned light energy.

The term "feedthrough optics" as it is used with reference to FIG. 4 denotes an arrangement of optical components whose function is to transmit light incident upon a first port for emission from a second port, such that the proportion of light energy emitted from the second port as compared to that incident upon the first port is dependent upon the wavelength of the light. The dependence upon the wavelength of the light provides a filtering effect intended to define the wavelengths of lasing of the MWML laser such that wavelengths experiencing a greater proportion of transmitted light energy are, in general, chosen as lasing wavelengths over those wavelengths experiencing a lesser proportion of transmitted light energy.

Figure 5A:
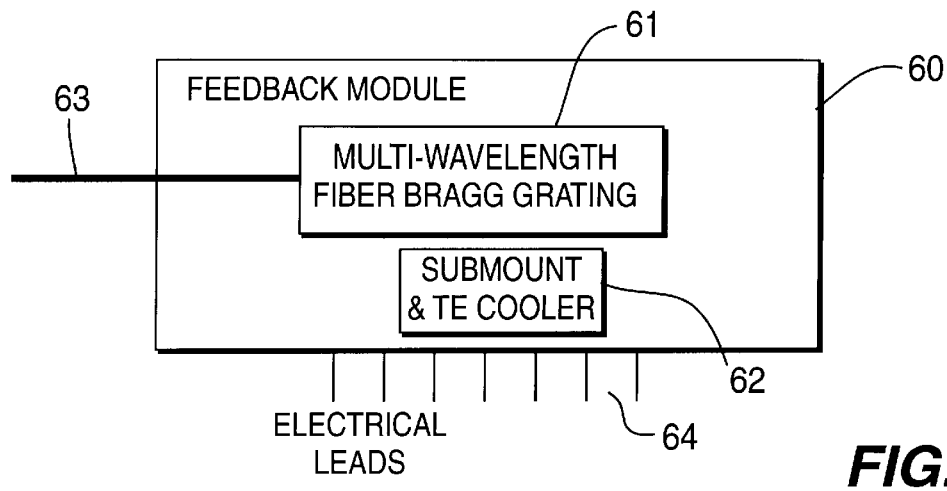
FIGS. 5(a)–5(c) illustrate alternative embodiments of hermetically sealed feedback modules in accordance with the invention.
Figure 5B:
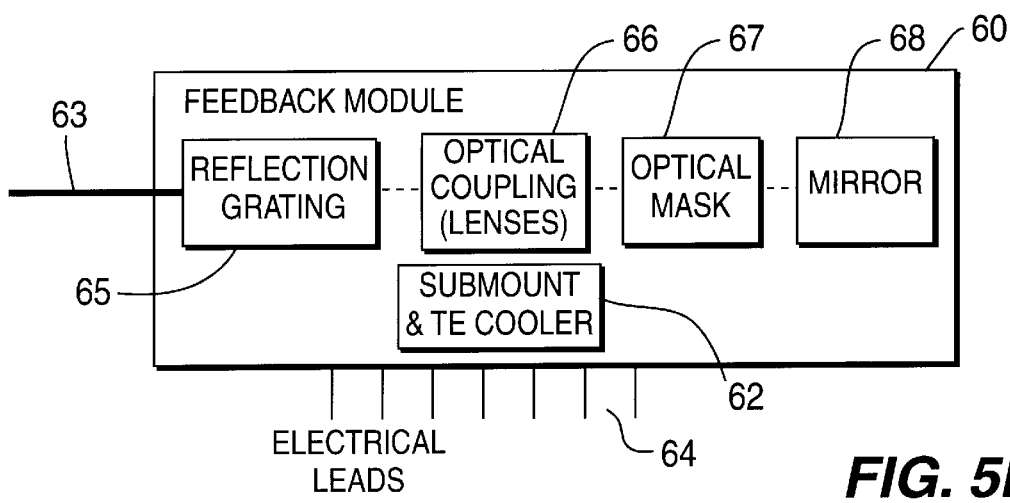
Figure 5C:
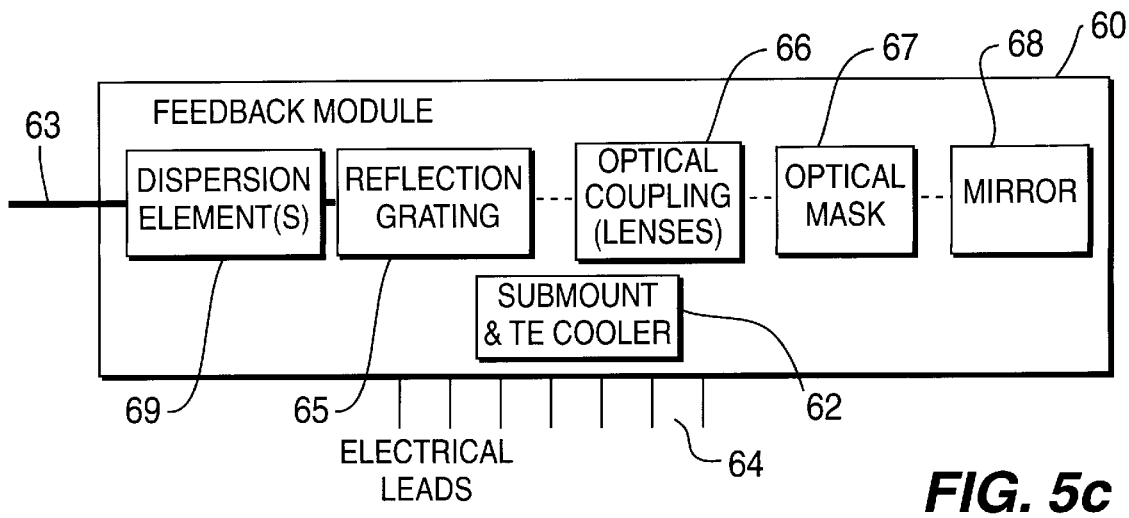

By way of examples, feedback optics and feedthrough optics may include wavelength-selective optical components such as fiber gratings, free-space gratings, interference filters, etalon filters, free-space resonators, integrated optic resonators, or other wavelength-selective optics which are deemed advantageous. In preferred embodiments, fiber gratings are preferred for their compactness and ease of package integration. For example, as shown in FIG. 5(a), a first embodiment of a feedback module 60 may contain a multi-wavelength fiber Bragg grating 61 mounted on a submount and thermoelectric cooler 62 which is sealed so that the only exposure to the environment is through the input fiber 63 and electrical leads 64. On the other hand, as shown in FIG. 5(b), the feedback module 60 may include a reflection grating 65 which is optically coupled to optical couplers (lenses) 66, optical mask 67, and mirror 68. As desired, dispersion elements 69 may also be provided prior to the reflection grating 65, as shown in FIG. 5(c). Other examples of suitable feedback modules will be apparent to those skilled in the art.

Extensions of the concepts embodied in FIG. 4 to include reflective cavity length adjustment as well as the use of multiple feedback optics, for example, will be discussed below with respect to FIGS. 7(a)–7(c).

Figure 4A:
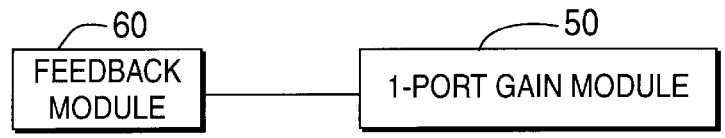
FIGS. 4(a)–4(h) illustrate several embodiments of the construction of the laser resonator of a MWML laser in accordance with the invention.

A schematic diagram of a preferred embodiment illustrated in FIG. 4(a) includes a one-port gain medium 50, such as a one-port angled-stripe SOA, combined with feedback optics 60, such as the single feedback grating structure of FIGS. 5(a)–5(c), whereby the net gain and roundtrip travel time associated with each of the discrete wavelengths are substantially identical for all wavelengths to be emitted. The particular requirement for substantially equal roundtrip travel times demands that, in the case of a fiber grating, the grating structure comprises periodic variation of refractive index within the glass fiber so as to provide the feedback for all wavelengths at substantially the same position along the length of the fiber. Substantially equal net gain for all wavelengths must be furnished by means of careful fabrication of the grating structure. Output is taken from a second port of a one-port angled-stripe SOA (not shown in FIG. 4(a)), if available, or from an optical fiber splitter allowing a portion of the intracavity signal to be out-coupled from the MWML laser (also not shown in FIG. 4(a)). This embodiment is presently preferred due to the economy of components which is conducive to economical manufacture.

Figure 4B:
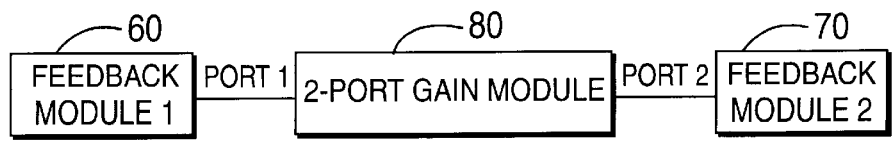

FIG. 4(b) illustrates a modification to the preferred embodiment consisting of a MWML laser having a 2-port gain medium 80 with feedback optics 60 and 70 coupled to respective ports of the two-port angled-stripe SOA gain medium 80 in a Fabry-Perot cavity configuration. The feedback optics 60 and 70 preferably each comprise fiber gratings having a plurality of grating structures situated in separate non-overlapping positions along the length of the fiber with distinct periodicities each reflecting one MWML laser wavelength, where respective grating structures in each of the first and second feedback optics 60 and 70 reflect respectively shorter wavelengths from a first end to a second end of each grating structure. These first and second fiber gratings 60 and 70 are then arranged such that the first fiber grating 60 has its first end interfaced with the first angled-stripe SOA port and the second fiber grating 70 has its second end interfaced with the second angled-stripe SOA port so as to provide substantially identical round-trip travel times within the lasing cavity for pulses at each of the plurality of wavelengths. The MWML laser design of this embodiment, which employs dual grating structures, is advantageous in instances where an individual grating structure providing substantially equal roundtrip times for all wavelengths to the port cannot be manufactured consistent with other requirements such as substantially equal net gain for all wavelengths.

Figure 6:
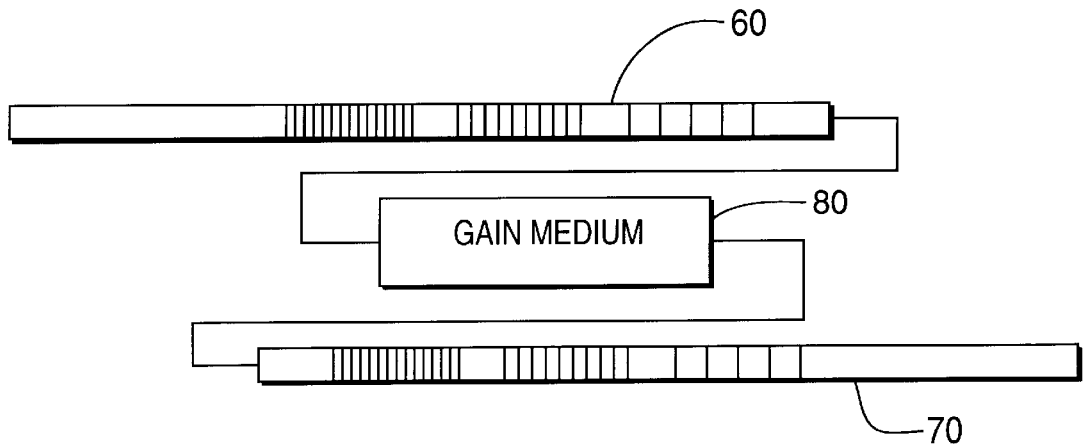
FIG. 6 illustrates an example of a MWML laser of the type shown in FIG. 4(b), in which the two feedback optics comprise fiber gratings.
Figure 8:
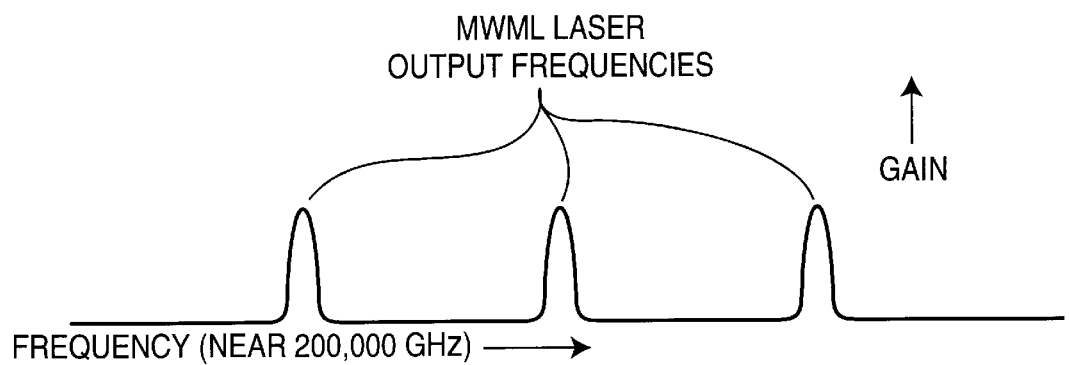
FIG. 8 illustrates the optical gain as a function of optical frequency of a MWML laser of the invention for a simple 3-wavelength example.

An essential function of the MWML laser resonator is to provide equal round-trip time for all the lasing wavelengths. FIG. 6 illustrates an example of a MWML laser of the type shown in FIG. 4(b), in which the two feedback optics comprise fiber gratings 60 and 70. In this example, each fiber contains three separate grating structures of three distinct periodicities reflecting three distinct wavelengths. However, the two fibers are arranged such that the order of the gratings is reversed, as measured outward from the gain medium 80, so that the round trip travel time of each of the three wavelengths within the Fabry-Perot cavity resonator is identical. Thus, while the shortest wavelength propagates a longer distance in the left-side fiber than in the right side fiber, and the longest wavelength propagates a longer distance in the right-side fiber than in the left-side fiber in FIG. 6, nevertheless, all wavelengths reflected by the fiber gratings 60 and 70 propagate the same total distance. This same approach may be used for fibers containing numerous separate grating structures with distinct periodicities reflecting numerous distinct wavelengths.

The criterion of equal round-trip travel times for each wavelength is essential to achieving mode-locking at the RF drive frequency applied to modulate the gain of the gain medium. Since the RF drive frequency is inversely proportional to cavity round-trip travel time, all wavelengths can simultaneously achieve mode-locking only if their round-trip times are substantially equal.

Figure 4C:
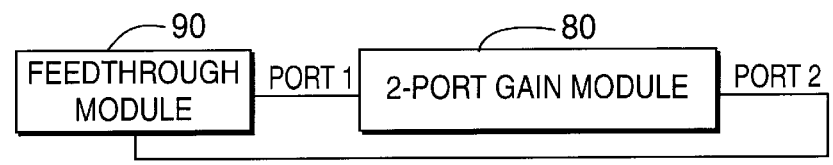

Other arrangements besides the ones shown in FIGS. 4(a), 4(b), and 6 can be devised to provide equal round-trip travel times for multiple wavelengths within a MWML laser in accordance with the invention. FIG. 4(c) illustrates a modified embodiment based on a 2-port gain medium 80 combined instead with feedthrough optics 90 to construct a ring-resonator-based MWML laser. Fabrication of feedthrough optics may be simpler than feedback optics using either fiber gratings or planar waveguide circuits. Planar waveguide circuits may include dispersive elements such as gratings, arrayed waveguide gratings, or other dispersive elements. Alternatively, free space optics can be employed for the feedthrough optics. The essential quality of the feedthrough optics 90 is the ability to transmit only the wavelengths of emission of the MWML laser while transmitting no other wavelengths with substantially similar net gain. It is a characteristic of feedthrough optics that they may also reflect and thus function as feedback optics. The use of optical isolators (not shown explicitly in FIG. 4(c))

within the feedthrough optics 90 adjacent to each port eliminates the tendency of the reflectivity associated with feedthrough optics from causing parasitic oscillations within the MWVML laser.

One advantage of a ring laser architecture, such as that shown in FIG. 4(c), is that equal round-trip travel times for all MWML laser wavelengths may be achieved conveniently. This is because transmission filters may be devised which pass light in a narrow band while blocking it in a wider band using two serial gratings offset by a phase shift. An example of the use of such transmission filters sequentially as part of a ring architecture is shown in FIG. 7(a), where filter transmission characteristics are schematically shown beneath each transmission filter 160. By cascading individual transmission filters 160 as shown, a transmission characteristic similar to that depicted in FIG. 8 can be achieved. Isolators 170 are employed to permit only ring lasing and to prevent lasing from each filter=s out-of-band reflection. A splitter 180 separates the output light from the feedback light.

Figure 7A:
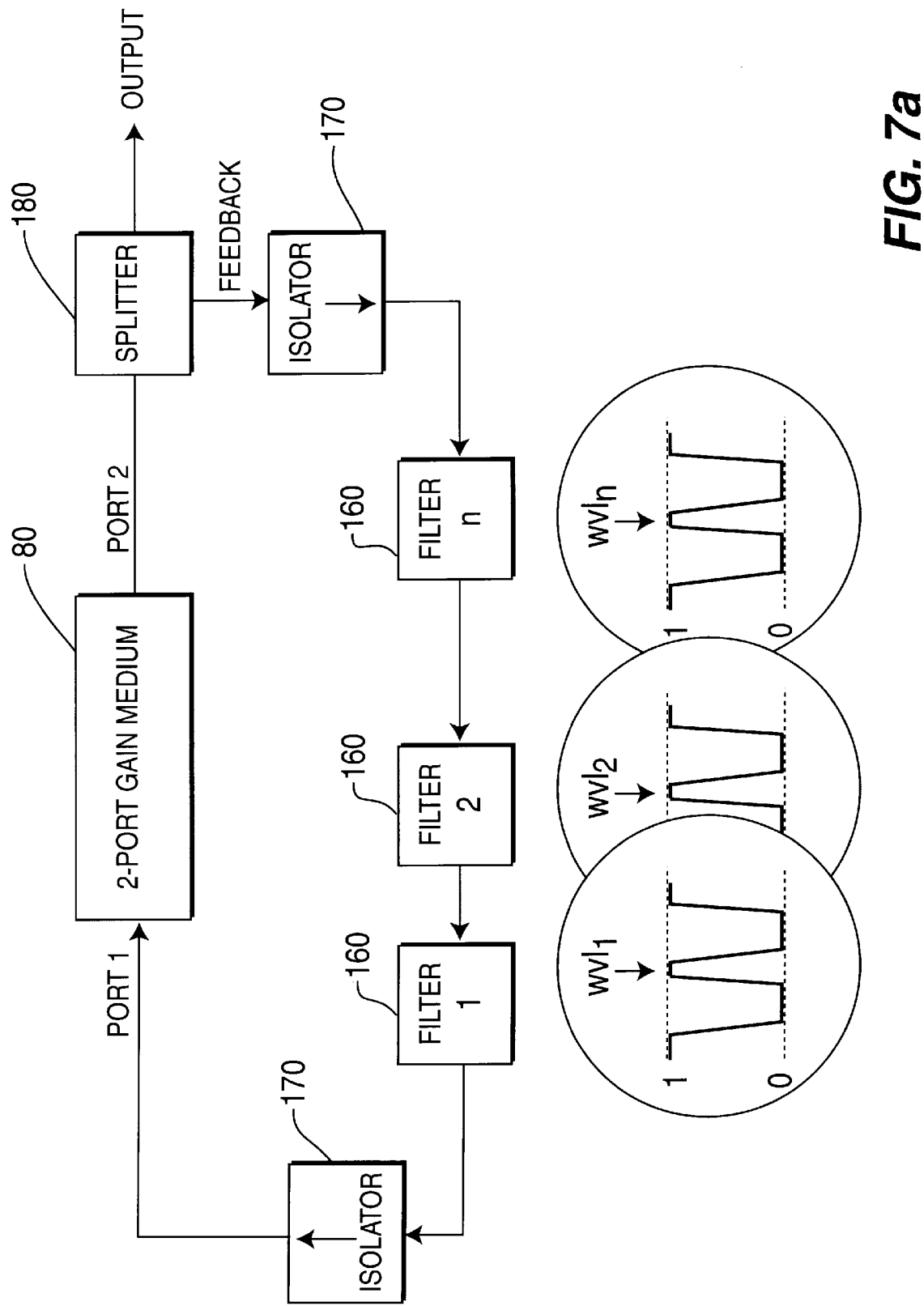
FIGS. 7(a) and 7(b) illustrate the use of transmission filters devised to pass light in a narrow band while blocking it in a wider band using two serial gratings offset by a phase shift, where such filters are used sequentially as part of a ring architecture.

The ring resonator design of FIG. 7(a) has a distinct advantage over the Fabry-Perot design of FIG. 6 in that the circulating pulse passes through the gain medium 50 once every round trip and does not experience attenuation during the round trip. Such attenuation can be the result of passing through the gain medium 80 at a time when the gain has been depleted, as can occur for non-ring cavity configurations. The same cannot be said for the design of FIG. 6 in which the circulating pulse passes through the gain medium 80 twice on each round trip instead of once. This problem can be mitigated by placing the gain medium 80 close to one fiber mirror of the laser of FIG. 6. In such a case, although the pump passes through the gain medium 80 twice, the two passes are temporally close. Those skilled in the art will further appreciate that a key requirement of the design of transmission filters 160 using fiber grating technology is the prevention of occlusion of passbands by the rejection band of spectrally adjacent filters used in the construction of the MWML lasers.

Other filter configurations may be used to provide the same functionality as the transmission filter chain 160 shown in FIG. 7(a). For example, such filter configurations may include planar waveguide arrangements which permit a multiplicity of discrete wavelengths to be passed from an input port to an output port while neither reflecting nor transmitting out-of-band wavelengths.

Figure 4D:
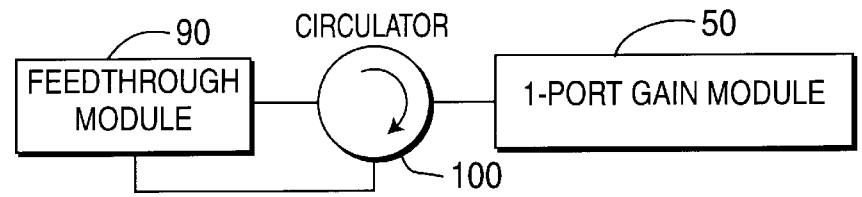

FIG. 4(d) illustrates a modified embodiment consisting of a second type of ring-resonator-based MWML laser having a one-port gain medium 50 combined with feedthrough optics 90 and an optical circulator 100. The advantages resulting from the use of feedthrough optics as discussed with reference to FIG. 4(c) are preserved, while a one-port gain medium 50 is employed. The optical circulator 100 satisfies the same need as the optical isolators 170 described above. The configuration has the advantage of employing a one-port gain medium 50 which may be more economical compared to a two-port medium due to the simpler packaging requiring fewer single-mode fiber alignments. Not shown in FIG. 4(d) is output coupling optics by which a portion of the intracavity power is extracted. A splitter which accomplishes this function is shown and described in more detail below with respect to FIG. 7(b).

Figure 4E:
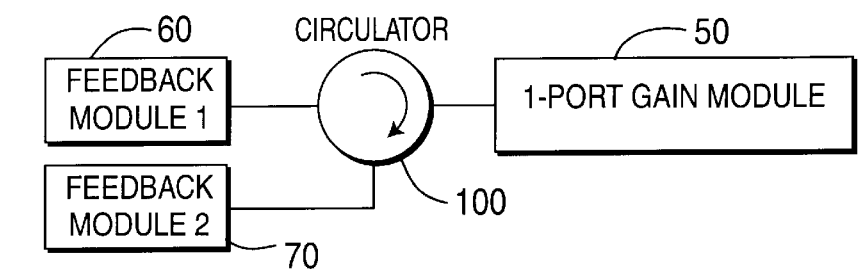

FIG. 4(e) illustrates a modified embodiment employing an optical circulator 100 to provide multiple feedback optics (60 and 70) to a single 1-port gain medium 50. In this embodiment, the two feedback structures employed in the embodiment of FIG. 4(b) are employed to provide equal roundtrip times for all MWML laser wavelengths as described there, but implemented in a ring resonator laser configuration with its advantages as discussed in connection with FIG. 4(c). This arrangement is advantageous in ensuring equal round trip travel times for all wavelengths, as in the embodiment of FIG. 7(b).

Figure 4F:
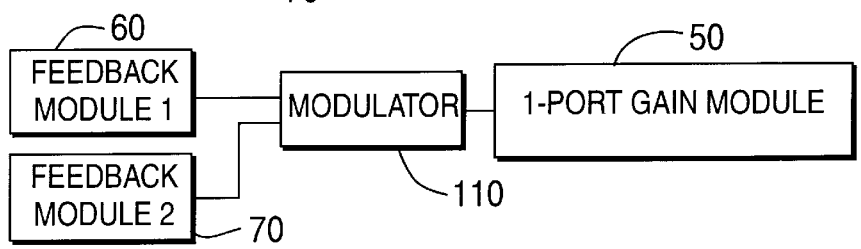

FIG. 4(f) illustrates an alternative embodiment to that of FIG. 4(e) in which a modulator 110 is employed in place of optical circulator 100 to alternately direct the pulses from one set of feedback optics to the other, also allowing dual reflective feedback elements to be used. Those skilled in the art will appreciate that the cavity path is altered such that a single round trip includes two passes through the gain element 50. The arrangement of FIG. 4(f) may be preferable where modulator costs, including drive electronics, are significantly less than circulator costs. It is possible that such a modulator 110 could be integrated monolithically with the gain medium 50 in this connection.

Figure 4G:
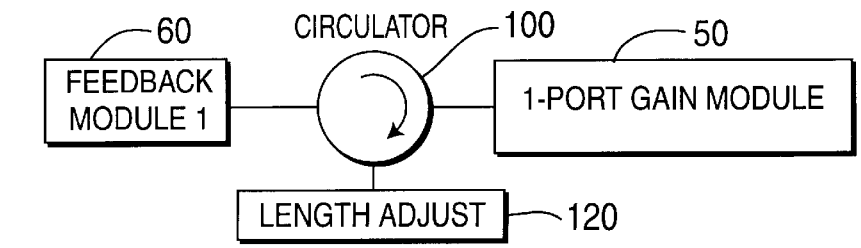
Figure 4H:
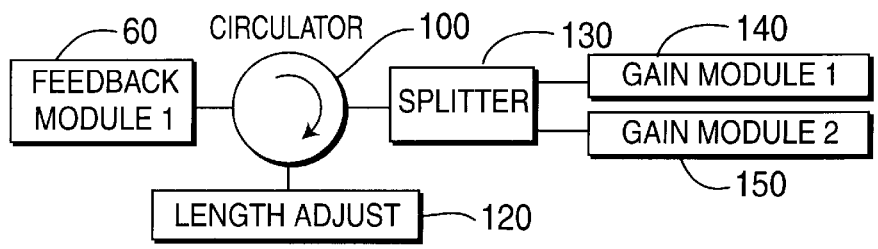

FIG. 4(g) illustrates the use of a length adjusting arm 120 with an optical circulator 100 of a similar configuration to that used in FIG. 4(e). Length adjustment can be made under strictly mechanical control or under piezoelectric mechanical control as may be useful to permit automatic servo-loop optimization of mode-locked operation. The latter is helpful to achieve synchronization of the MWML laser repetition rate to that of an external clock, in conjunction with phase-lock control over the RF clock driver of the MWML laser. Multiple circulators 100 can be combined to add ports, as needed to create a four-port or higher-order circulator. If a second circulator 100 is added, the length adjusting arm 120 could be used in conjunction with two feedback optics instead of just one as shown in the embodiment of FIG. 4(e). The length adjusting arm design can be preferentially combined with any of the other embodiments of the present invention.

Figure 7B:
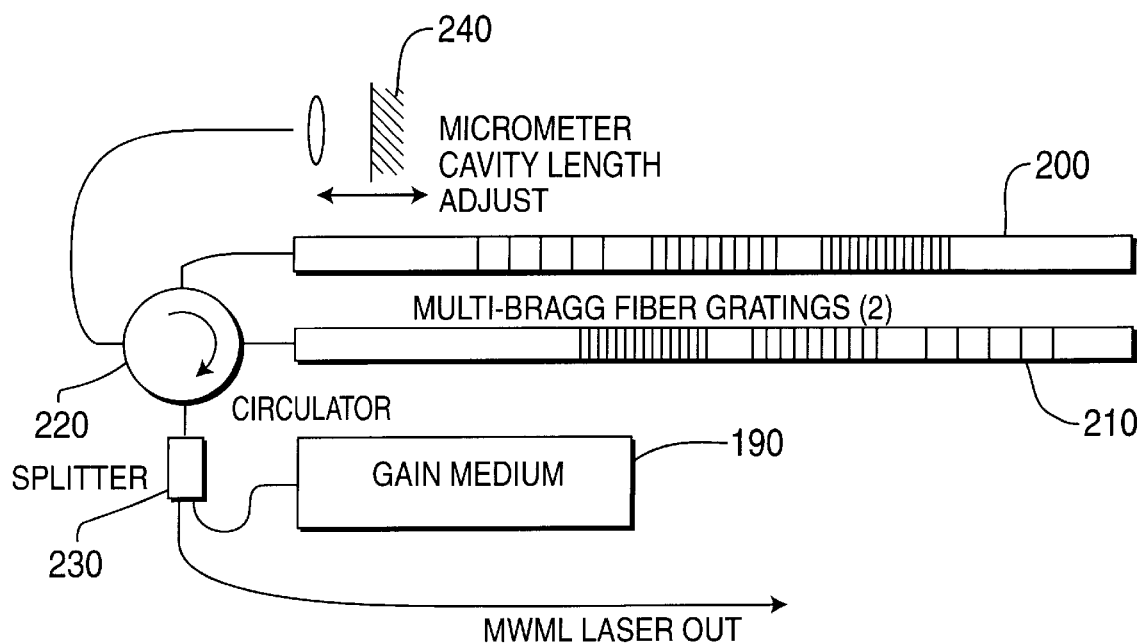
Figure 7C:
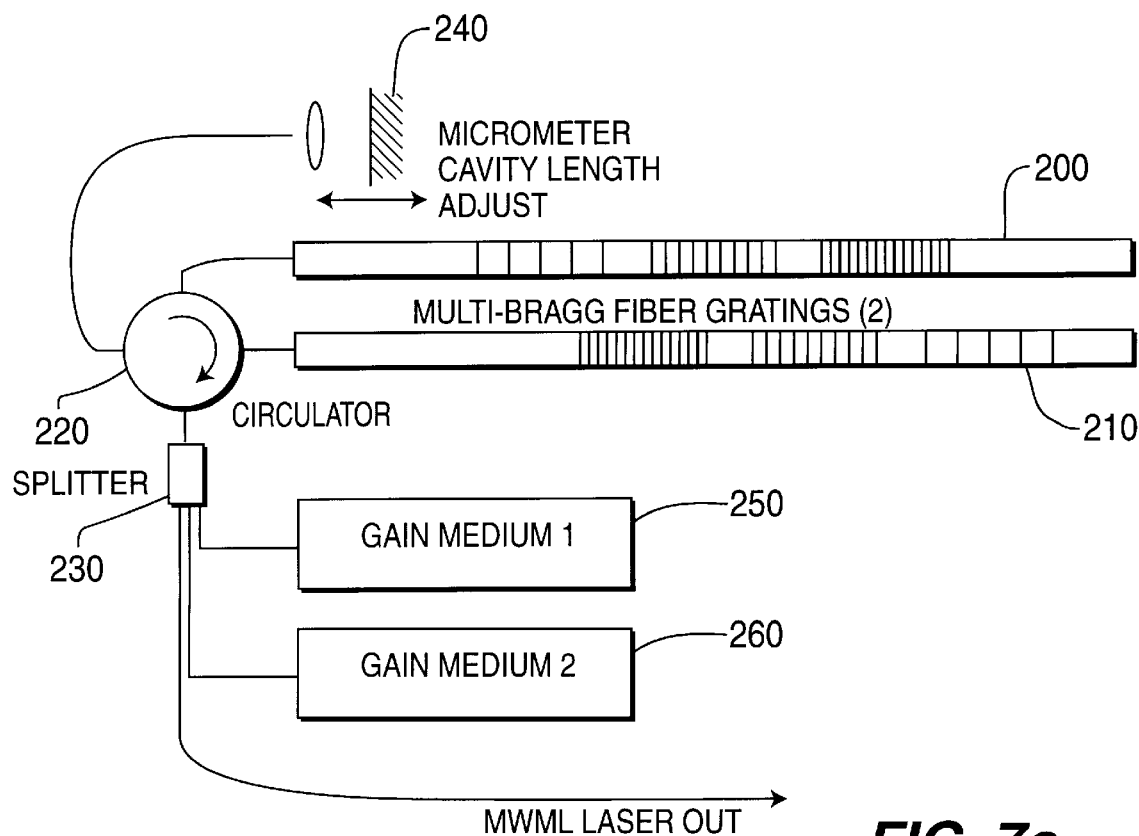
FIG. 7(c) illustrates two 1-port gain media combined in parallel, using a splitter, to provide protection against failure of one gain medium.

Details of the design for a MWML laser resonator of the type shown in FIG. 4(g) is shown schematically in FIG. 7(b). The design of FIG. 7(b) provides for substantially equal round trip travel times within the cavity for the various wavelengths. As shown in FIG. 7(b), this MWML laser resonator is fiber-based and employs a single-ended gain medium 190 connected to conventional Bragg fiber gratings 200 and 210 via optical circulator 220 and splitter 230 so as to permit the circulating pulses to pass through the gain medium 190 once every round trip. Manual cavity length adjuster (micrometer) 240 is provided to fine-tune the cavity length to adjust pulse repetition rates mechanically. In the design of FIG. 7(b), the two identical multi-Bragg fiber gratings 200 and 210 are employed in opposite orientations as in FIG. 6 so as to provide the same round trip travel times for each of the wavelengths. It is possible to expose the fiber gratings 200 and 210 simultaneously in both fibers to ensure that they are identical. The fourth circulator port of optical circulator 220 accepts inputs from micrometer 240 to adjust the cavity length. If adequate cavity adjustment can be obtained by other means, this port can be eliminated and a three-port circulator substituted for the four-port optical circulator 220 shown in FIG. 7(b). The splitting ratio of the splitter 230 is preferably approximately 10% to the output and 90% to the gain medium 190. The MWML laser operates only slightly above threshold to obtain the optimum pulses; higher power is obtained by post-amplification.

A key benefit of the use of a 1-port gain module of FIG. 7(b) is the simplicity of packaging involved. As noted above, fiber optic components installed in network applications are required to be qualified as to reliability. Accordingly, existing techniques have been firmly established for use with 1-port emitters such as DFB lasers to permit their qualification for high-reliability applications, with guidelines set forth in Bellcore Technical Reference TR-NWT-000468, *Reliability Assurance Practices for Optoelectronic Devices in Interoffice Applications* (Bellcore, Livingston, N.J.). A variety of methods to produce highly reliable angled-stripe SOA emitter modules are known to those skilled in the art. Such methods are practiced in the manufacture of DFB laser chips which are mounted in so-called butterfly packages that provide internal thermoelectric temperature sensing and control, stable single-mode-fiber coupling, back-facet power monitoring, high-frequency modulation capability, and optical isolation. With the exception of optical isolation, the same features are required for a 1-port gain module to be used in the MWML laser of the invention.

FIG. 4(*h*) illustrates the use of a splitter 130 with two gain media 140 and 150 to provide redundancy against failure of the gain medium, the only active light emitting element in the MWML laser. This is further illustrated by FIG. 7(*c*). The use of two gain media can be accomplished by matching the lengths of the optical paths within the gain media such that the same roundtrip travel time is maintained for either of the two gain media. The 3 dB loss associated with each pass through the splitter 130 is overcome by additional gain of the angled-stripe SOA. The enhancement to reliability provided by the use of a dual gain element design is substantial. The redundant gain medium design can preferentially be combined with any of the other embodiments of the present invention.

It is important to note that the mode-locked lasers of the designs of FIGS. 4(*a*)–4(*h*) operate best near threshold and do not emit large powers. However, power outputs greater than 100 mW average power can be obtained with the help of a power amplifier.

In each of the MWML laser embodiments of FIGS. 4(*a*)–4(*h*), net optical gain is designed to be substantially equal at all the wavelengths of lasing. To the extent that it is not, it is possible to implement power leveling external to the MWML laser using means similar to those employed to level the gain of erbium doped fiber amplifiers known to those skilled in that art.

As noted above, the above embodiments of the invention have been designed so that the critical and active components may be contained within hermetically sealed single-mode fiber pigtailed packages such that no organic materials such as epoxy are contained within the packages. FIG. 9 illustrates such packages for implementing the 1-port gain module 50 (FIG. 9(*a*)) and the 2-port gain module 80 (FIG. 9(*b*)). As illustrated in FIG. 9(*a*), the 1-port gain module 50 includes a hermetically sealed, organics free enclosure 51 which encloses, for example, an optical fiber 52, optical couplers (lenses) 53, and a 1-port angled-stripe active element 54 mounted on a submount and thermoelectric cooler 55. The only connections to the environment are optical fiber 56 and electrical leads 57, which pass through a hermetic feedthrough 58. Similarly, as illustrated in FIG. 9(*b*), the 2-port gain module 80 includes a hermetically sealed, organics free enclosure 81 which encloses, for example, optical fibers 82 and 83, optical couplers (lenses) 84 and 85, and a 2-port angled-stripe active element 86 mounted on a submount and thermoelectric cooler 87. The only connections to the environment are optical fibers 88 and 89 and electrical leads 57, which pass through a hermetic feedthrough 58.

Because the packaging, including die-bonding, metalization, wirebonding, and other aspects of the MWML laser of the invention are similar to that of conventional DFB lasers, it can be anticipated that the reliability of the gain medium of the MWML laser of the invention will be similar to that of standard DFB lasers emitting in the 1.55 μm or 1.31 μm wavelength bands. While it is necessary to test the complete MWML laser, the similarity of materials and methods suggests that reliability qualification will be readily achieved.

Those skilled in the art will appreciate that a two-port gain module requires dual fiber coupling, a configuration which is not currently widely practiced in the manufacture of angled-stripe SOA light emitters. Therefore, a MWML laser design which employs a one-port gain module may generally be preferable to a design which employs a two-port gain module.

Another advantage of one-port gain media is that two may be conveniently combined in parallel, using a single splitter, to provide protection against failure of one gain medium. An example is shown in FIG. 7(*c*). In the embodiment of FIG. 7(*c*), the splitting ratios are preferably approximately 10% to the output, and 45% to each of the two gain media. The lengths of the two fibers going to each gain medium 250 or 260 must be closely matched. In practice, only one of the two gain media 250 or 260 would be biased and actively mode-locked. Electronic switchover to the other gain medium would be initiated upon fault detection in the optical transmission system. For two-port gain media configurations, two splitters are required.

A one-port gain module of a MWML laser in accordance with the invention is based on a one-port SOA. A two-port gain module of a MWML laser in accordance with the invention is based on a two-port SOA. Such optical amplifiers are best implemented using an angled-stripe design, for such designs have been demonstrated to result in broadband low reflectivity of on the order of $10^{-6}$. Each angled-stripe port is coupled to a fiber within the package for a one-port gain module.

Figure 10A:
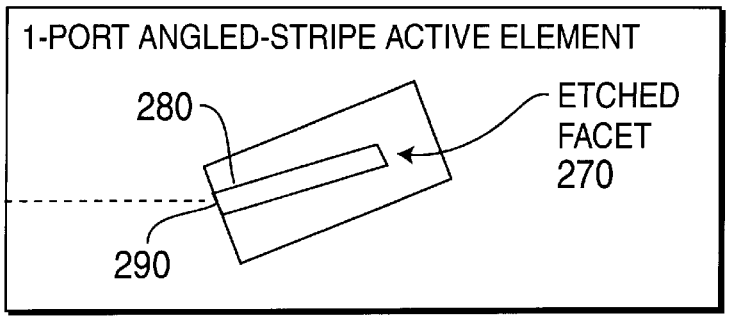
FIGS. 10(a) and 10(b) illustrate alternative designs for 1-port angled-stripe etched facet SOAs in accordance with the invention.
Figure 10B:
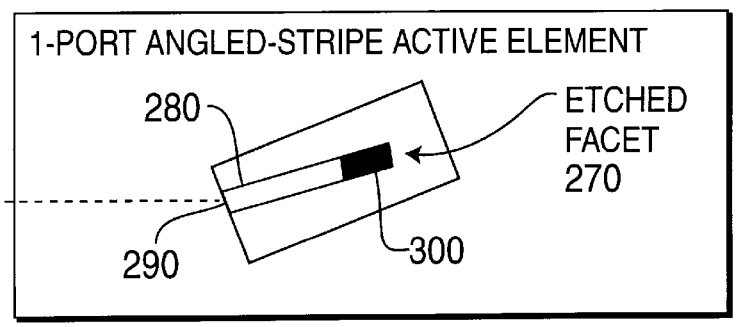
Figure 11A:
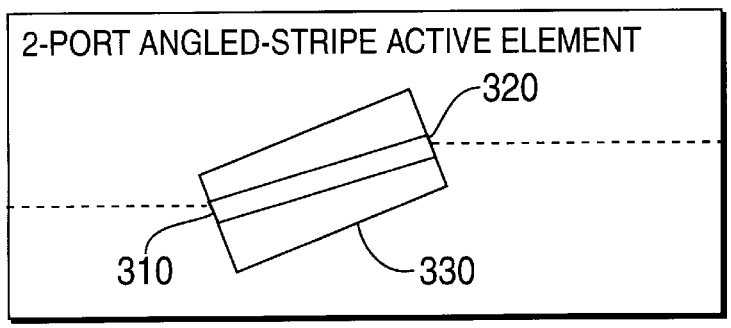
FIGS. 11(a) and 11(b) illustrate alternative designs for 2-port angled-stripe etched facet SOAs in accordance with the invention.
Figure 11B:
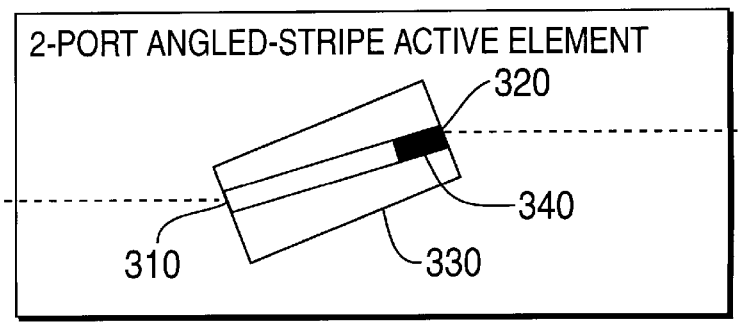

Two designs for one-port angled-stripe SOAs useful as a gain medium in a MWML laser in accordance with the invention are schematically shown in FIGS. 10(*a*) and 10(*b*). The etched-facet design of FIG. 10(*a*) employs a facet 270 etched into the waveguide 280 to provide reflectivity from one end of the gain medium, while employing an angled facet 290 at the external-cavity-coupled end. As illustrated in FIG. 10(*b*), a saturable absorber 300 may also be disposed adjacent the etched facet 270. Comparable designs for two-port angled-stripe SOAs useful as a gain medium in a MWML laser in accordance with the invention are schematically shown in FIGS. 11(*a*) and 11(*b*). In these embodiments, Angled facets 310 and 320 are provided at each end of the waveguide 330. Alternatively, as illustrated in FIG. 11(*b*), a saturable absorber 340 may also be disposed adjacent one of the facets.

It is to be understood that the apparatus and method of operation taught herein are merely illustrative of the invention. Modifications may readily be devised by those skilled in the art without departing from the spirit or scope of the invention. For example, the optimum period of MWML pulses may be significantly longer than the rate required by the associated optical transmission system. In such a case, longer period pulses may be interleaved to achieve shorter periods by methods known to those skilled in the art. Also, a bent waveguide design may be used in place of the etched facet design. In such a design, a first facet employed for external cavity coupling is angled with respect to the waveguide, while the second facet is normal to the waveguide. The second facet may be employed for output coupling to extract pulses from the MWML laser. All such modifications are intended to be included within the scope of the appended claims.

I claim:

1. A multiwavelength actively mode-locked external cavity semiconductor (MWML) laser, said MWML laser comprising:

at least one optical gain module comprising a semiconductor optical amplifier (SOA) disposed in said cavity which is biased by a radio frequency signal having a frequency that substantially equals the rate at which optical pulses circulate within the cavity, said SOA being mounted in a hermetically-sealed package and simultaneously outputting at a port of said SOA periodic pulses at a plurality of wavelengths;

at least one of feedback and feedthrough modules coupled to said port of said SOA so as to provide substantially identical round-trip travel times within said cavity for pulses at said plurality of wavelengths and net gains which are substantially equal at each generated wavelength.

2. An MWML laser as in claim 1, wherein said feedback module provides simultaneous feedback of single-mode light at said plurality of wavelengths and provides substantially identical round-trip travel times within said cavity and net gains which are substantially equal at each generated wavelength, said feedback optics being coupled to said port of said SOA by a single-mode fiber optic coupling.

3. An MWML laser as in claim 1, wherein said feedthrough module is coupled to said SOA so as to provide simultaneous feedthrough of single-mode light at said plurality of wavelengths and to provide substantially identical round-trip travel times within said cavity and net gains which are substantially equal at each generated wavelength, said feedthrough optics being coupled to said port of said SOA by a single—mode fiber optic coupling.

4. An MWML laser as in claim 1, wherein said SOA comprises an angled-stripe InP-based angled-stripe SOA optical traveling wave amplifier having one of an InGaAsP and an InGaAs active region.

5. An MWML laser as in claim 1, wherein said SOA comprises an angled-stripe GaAs-based angled-stripe SOA optical traveling wave amplifier having one of an lnGaAs, an InGaAlAs, an InGaAlP, and an GaAs active region.

6. An MWML laser as in claim 1, wherein said feedback module comprises a fiber grating that preferentially reflects discrete wavelengths of light received from said port of said SOA.

7. An MWML laser as in claim 1, wherein said SOA comprises an angled-stripe SOA having a single facet from which light propagates through said port of said SOA, and said feedback optics comprises a fiber grating to and from which light passes though said port.

8. An MWML laser as in claim 7, wherein said SOA includes a reflector which emits amplified received pulses at said plurality of wavelengths and outputs said amplified pulses to said port.

9. An MWML laser as in claim 8, wherein said reflector comprises a facet of a semiconductor chip containing said SOA.

10. An MWML laser as in claim 8, wherein said reflector comprises a mirror situated within said hermetically sealed package to reflect substantially all light emerging from a facet of the SOA back into the SOA.

11. An MWML laser as in claim 1, wherein said SOA has first and second ports, and said feedback optics comprises first and second fiber gratings with first and second ports which respectively interface to said first and second ports of the SOA.

12. An MWML laser as in claim 11, wherein said first and second fiber gratings each have a plurality of grating structures with distinct periodicities reflecting said plurality of wavelengths, where respective grating structures in each of said first and second fiber gratings reflect respectively shorter wavelengths from a first end to a second end, and where said first and second fiber gratings are arranged whereby said first fiber grating has its first end interfaced with said first port and said second fiber grating has its second end interfaced with said second port so as to provide substantially identical round-trip travel times within said cavity for pulses at each of said plurality of wavelengths.

13. An MWML laser as in claim 1, wherein said SOA has first and second ports, and said feedthrough optics are connected to said first and second in an optical ring resonator configuration.

14. An MWML laser as in claim 13, wherein said SOA has first and second facets, one of said facets corresponding to one of said ports, and said feedback optics comprises a splitter which splits off a portion of an output at said one port and provides said portion of said output to a plurality of cascaded transmission filters which pass light in respective narrow bands and block said light in a wide band, where said splitter and said plurality of transmission filters are connected in said ring resonator configuration between said first and second facets.

15. An MWML laser as in claim 14, wherein said ring resonator configuration further comprises a first optical isolator between said splitter and said plurality of transmission filters and a second optical isolator between said plurality of transmission filters and the facet of said SOA not corresponding to said one port, said first and second optical isolators substantially preventing lasing by said SOA due to reflection of light outside of said narrow bands by said plurality of cascaded transmission filters.

16. An MWML laser as in claim 13, wherein said SOA has first and second facets, one of said facets corresponding to one of said ports, and said feedback optics comprises a splitter which splits off a portion of an output at said one port and provides said portion of said output to a planar waveguide which permits a plurality of narrow bands of discrete wavelengths to be passed from an input thereof to an output thereof while neither reflecting nor transmitting light outside of said narrow bands, where said splitter and said planar waveguide are connected in said ring resonator configuration between said first and second facets.

17. An MWML laser as in claim 1, wherein said SOA has a facet corresponding to said port, and said feedback optics comprises a fiber grating and an optical circulator having a first port interfaced to said facet and second and third ports connected to respective ends of said fiber grating in an optical ring resonator configuration.

18. An MWML laser as in claim 1, wherein said SOA has a facet corresponding to said port, and said feedback optics comprises first and second fiber gratings and an optical circulator having a first port interfaced to said facet and second and third ports respectively connected to said first and second fiber gratings so as to provide at least two feedback paths to said SOA.

19. An MWML laser as in claim 1, wherein said SOA has a facet corresponding to said port, and said feedback optics comprises first and second fiber gratings and a modulator which selectively directs pulses at said plurality of wavelengths from said port of said SOA to said first and second gratings so as to provide at least two feedback paths to said SOA.

20. An MWML laser as in claim 1, wherein said SOA has a facet corresponding to said port, and said feedback optics comprises a fiber grating, a cavity length adjusting arm, and an optical circulator having a first port interfaced to said facet, a second port connected to said fiber grating, and a third port connected to said cavity length adjusting arm.

21. An MWML laser as in claim 1, further comprising a second SOA which is actively mode-locked so as o utput individual spectral components at said plurality of wavelengths, said feedback optics comprising a fiber grating, a cavity length adjusting arm, a splitter, and an optical circulator having a first port connected to said splitter so as to split light to said SOA and said second SOA, a second port connected to said fiber grating, and a third port connected to said cavity length adjusting arm.

22. An MWML laser as in claim 1, wherein said SOA has a facet corresponding to said port, and said feedback optics comprises first and second fiber gratings, a splitter which splits output light from said SOA for output and feedback to said angled-stripe SOA, and an optical circulator having a first port interfaced to said splitter, a second port connected to said first fiber grating, and a third port connected to said second fiber grating.

23. An MWML laser as in claim 22, wherein said first and second fiber gratings each have a plurality of grating structures with distinct periodicities reflecting said plurality of wavelengths, where respective grating structures in each of said first and second fiber gratings reflect respectively shorter wavelengths from a first end to a second end, and where said first and second fiber gratings are arranged whereby said first fiber grating has its first end connected to said second port and said second fiber grating has its second end connected to said third port so as to provide substantially identical round-trip travel times within said cavity for pulses at each of said plurality of wavelengths.

24. An MWML laser as in claim 23, further comprising a second SOA which outputs individual spectral components at said plurality of wavelengths, said splitter splitting off output light for application to said SOA and said second SOA to provide feedback to said SOA and said second SOA.

25. An MWML laser as in claim 1, wherein said cavity includes a bent waveguide, a first facet at a first end of the lasing cavity which is normal to the waveguide, and a second facet at a second end of the lasing cavity which is angled with respect to the waveguide and is used for external cavity coupling of said waveguide.

26. An MWML laser as in claim 1, wherein said cavity includes a waveguide, a first facet etched into said waveguide at a first end of the lasing cavity so as to provide reflectivity at said first end of the lasing cavity, and a second facet at a second end of the cavity which is at an angle to a normal to said waveguide.

\* \* \* \* \*